United States Patent
Seabaugh et al.

[11] Patent Number: 5,723,872
[45] Date of Patent: Mar. 3, 1998

[54] MIXED BARRIER RESONANT TUNNELING

[75] Inventors: Alan C. Seabaugh; Chih-Chen Cho, both of Richardson, Tex.

[73] Assignee: Texas Instruments Incorporated, Dallas, Tex.

[21] Appl. No.: 290,269

[22] Filed: Aug. 15, 1994

[51] Int. Cl.[6] .................... H01L 29/06; H01L 29/24
[52] U.S. Cl. ........................................... 257/25
[58] Field of Search ......................... 257/17, 22, 25

[56] References Cited

U.S. PATENT DOCUMENTS

| | | | |
|---|---|---|---|
| 3,121,177 | 2/1964 | Davis | 257/25 |
| 4,620,206 | 10/1986 | Ohta et al. | 257/17 |
| 4,665,412 | 5/1987 | Ohkawa et al. | 257/17 |
| 4,878,104 | 10/1989 | Reed et al. | 257/17 |
| 4,914,488 | 4/1990 | Yamane et al. | 257/17 |

FOREIGN PATENT DOCUMENTS

61-176163  8/1986  Japan ..................... 257/25

*Primary Examiner*—Jerome Jackson
*Assistant Examiner*—John Guay
*Attorney, Agent, or Firm*—Carlton H. Hoel; W. James Brady, III; Richard L. Donaldson

[57] ABSTRACT

A resonant tunneling diode (400) made of a quantum well (406) with tunneling barriers (404, 408) made of two different materials such as calcium fluoride (408) and silicon dioxide (404). The calcium fluoride provides lattice match between the emitter (410) and the quantum well (406). Further resonant tunneling diodes with silicon lattice match barriers may be made of III-V compounds containing nitrogen.

3 Claims, 8 Drawing Sheets

MIXED BARRIER RESONANT TUNNELING

CROSS-REFERENCE TO RELATED APPLICATIONS

The following coassigned U.S. patent applications disclose related subject matter: Ser. Nos. 08/290,275, cofiled with this application; 08/286,067, filed Aug. 4, 1994, now U.S. Pat. No. 5,466,949; 08/145,267, filed Oct. 29, 1993; 08/250,976, filed May 31, 1994, now U.S. Pat. No. 5,422,305; 07/704,535, filed May 23, 1991, now abandoned. 08/065,087, filed May 20, 1993, now abandoned; 08/048,406, filed Jun. 21, 1993, now U.S. Pat. No. 5,364,468.

BACKGROUND OF THE INVENTION

The invention relates to electronic devices, and, more particularly, to resonant tunneling devices and systems.

The continual demand for enhanced transistor and integrated circuit performance has resulted in improvements in existing devices, such as silicon bipolar and CMOS transistors and gallium arsenide MESFETs, and also in the introduction of new device types and materials. In particular, scaling down device sizes to enhance high frequency performance leads to observable quantum mechanical effects such as carrier tunneling through potential barriers. This led to development of alternative device structures such as resonant tunneling diodes and resonant tunneling hot electron transistors which take advantage of such tunneling phenomena.

Figure 1:
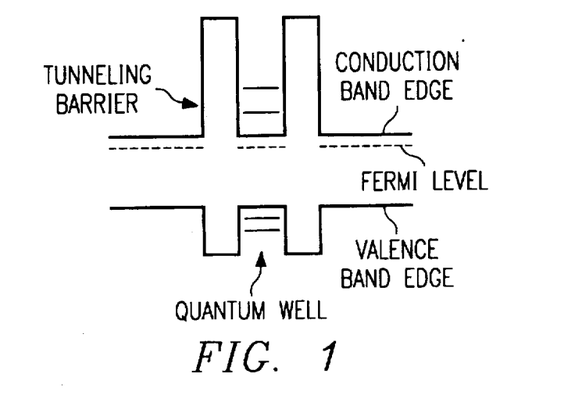
Figure 2:
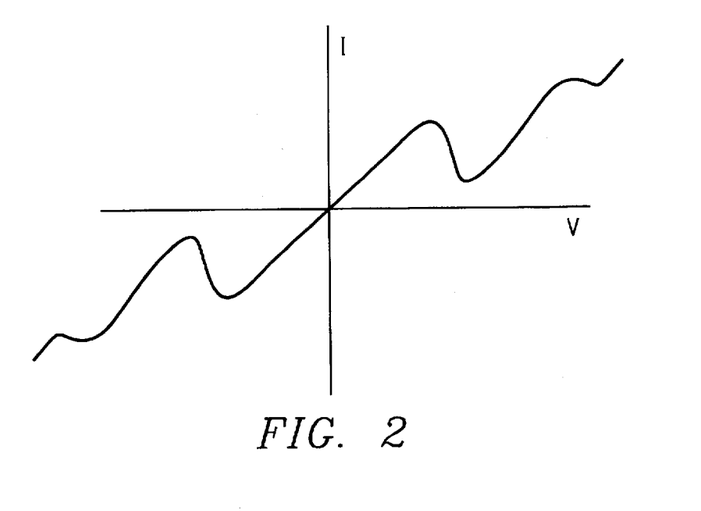
Figure 3A:
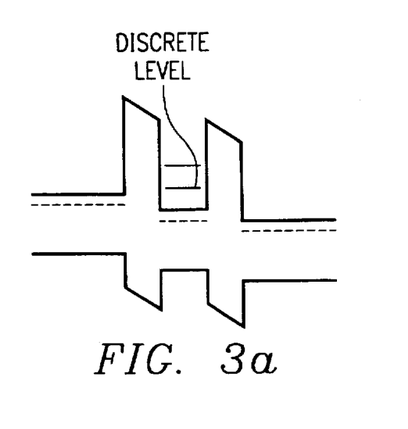
Figure 3B:
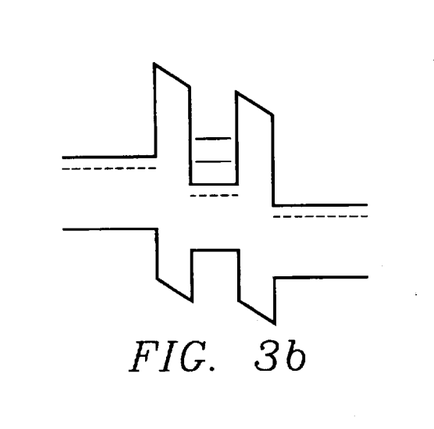

Resonant tunneling diodes are two terminal devices with conduction carriers tunneling through potential barriers to yield current-voltage curves with portions exhibiting negative differential resistance. Recall that the original Esaki diode had interband tunneling (e.g., from conduction band to valence band) in a heavily doped PN junction diode. An alternative resonant tunneling diode structure relies on resonant tunneling through a quantum well in a single band; see FIG. 1 which illustrates a AlGaAs/GaAs quantum well. Further, Mars et al., Reproducible Growth and Application of AlAs/GaAs Double Barrier Resonant Tunneling Diodes, 11 J. Vac. Sci. Tech. B 965 (1993), and Özbay et al, 110-GHz Monolithic Resonant-Tunneling-Diode Trigger Circuit, 12 IEEE Elec. Dev. Lett. 480 (1991), each use two AlAs tunneling barriers imbedded in a GaAs structure to form a quantum well resonant tunneling diode. The quantum well may be 4.5 nm thick with 1.7 nm thick tunneling barriers. FIG. 2 illustrates current-voltage behavior at room temperature. Note that such resonant tunneling "diodes" are symmetrical. With the bias shown in FIG. 3a, a discrete electron level (bottom edge of a subband) in the quantum well aligns with the cathode conduction band edge, so electron tunneling readily occurs and the current is large. Contrarily, with the bias shown in FIG. 3b the cathode conduction band aligns between quantum well levels and suppresses tunneling, and the current is small.

Attempts to fabricate quantum wells in silicon-based semiconductors, rather than the III–V semiconductors such as AlGaAs and GaAs, have focussed primarily on silicon-germanium alloys. For example, the Topical Conference on Silicon-Based Heterostructures II (Chicago 1992) included papers such as Grützmacher et al., Very Narrow SiGe/Si Quantum Wells Deposited by Low-Temperature Atmospheric Pressure Chemical Vapor Deposition, 11 J. Vac. Sci. Tech. B 1083 (1993)(1 nm wide wells of $Si_{0.75}Ge_{0.25}$ with 10 nm wide Si tunneling barriers) and Sedgwick et al., Selective SiGe and Heavily As Doped Si Deposited at Low Temperature by Atmospheric Pressure Chemical Vapor Deposition, 11 J. Vac. Sci. Tech. B 1124 (1993)(Si/SiGe resonant tunneling diode selectively grown in an oxide window with silicon tunneling barriers each 5 nm wide and a 6 nm wide quantum well of $Si_{0.75}Ge_{0.25}$. Because the valence band offset greatly exceeds the conduction band offset al SiGe/Si interfaces, most investigators consider hole tunneling rather than electron tunneling using strained layer SiGe.

However, SiGe strained layers possess a serious intrinsic impediment in that the band discontinuities are small (less than 500 meV). This precludes room temperature operation with large peak-to-valley current differences (greater than approximately 5). Further, the addition of a strained heterojunction and new material, germanium, necessitates the undesirable development and implementation of new low temperature fabrication methods to allow production.

Another epitaxial approach for silicon-based quantum wells uses calcium fluoride ($CaF_2$) as the tunneling barriers. Calcium fluoride lattice matches silicon for (111) oriented interfaces and may be epitaxially grown by molecular beam epitaxy. See Schowalter and Fathauer, 15 CRC Crit. Rev. Solid State Mater. Sci. 367 (1989); Cho et al., 10 J. Vac. Sci. Tech. A 769 (1992); and Cho et al., U.S. Pat. Nos. 5,229,332 and 5,229,333.

Tsu, U.S. Pat. No. 5,216,262, describes a silicon-based quantum well structure with tunneling barriers made of short period silicon/silicon dioxide superlattices of epitaxial silicon dioxide two monolayers thick.

Numerous investigators have studied the silicon/silicon oxide interface because it underlies performance of the currently prevalent CMOS transistor structure of silicon integrated circuits. The growth and analysis of single molecular layers of oxide have become commonplace. For example, Ohmi et al., Very Thin Oxide Film on a Silicon Surface by Ultraclean Oxidation, 60 Appl. Phys. Lett. 2126 (1992); Hattori, High Resolution X-ray Photoemission Spectroscopy Studies of Thin $SiO_2$ and $Si/SiO_2$ Interfaces, 11 J. Vac. Sci. Tech. B 1528 (1993); and Seiple et al., Elevated Temperature Oxidation and Etching of the Si(111) 7×7 Surface Observed with Scanning Tunneling Microscopy, 11 J. Vac. Sci. Tech. A 1649 (1993). The Ohmi et al. article observes that an oxide monolayer formed on a silicon wafer at 300° C. provides the foundation for oxide films superior to standard thermal oxide with respect to Frenkel-Poole emission for thin oxide films.

SUMMARY OF THE INVENTION

The present invention provides silicon-based resonant tunneling diodes and transistors with the two tunneling barriers made of dissimilar materials.

This has technical advantages including fabrication of resonant tunneling devices with standard silicon-compatible processes and thus integration with other silicon devices such as CMOS and bipolar transistors.

BRIEF DESCRIPTION OF THE DRAWINGS

The drawings are schematic for clarity.

FIGS. 1–3b are band diagrams of a known resonant tunneling diode together with a current-voltage diagram.

DESCRIPTION OF THE PREFERRED EMBODIMENTS

Overview of Mixed Crystalline/Amorphous Tunneling Barriers

Figure 4A:
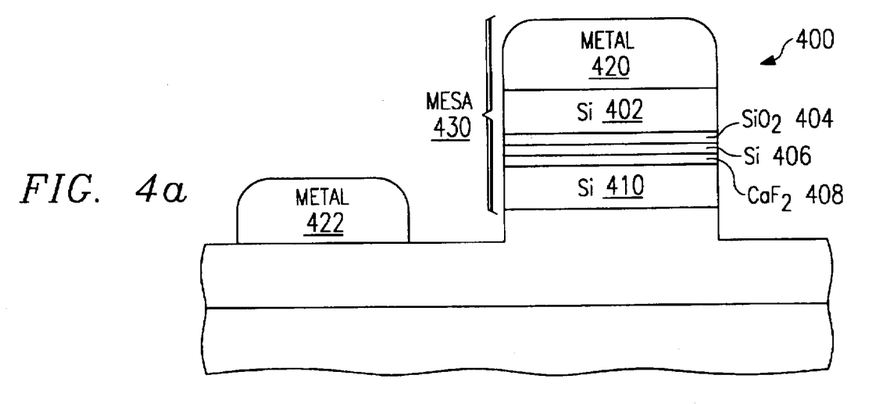
FIGS. 4a–b illustrate a first preferred embodiment mixed barrier resonant tunneling diode in cross sectional elevation and plan views.
Figure 4B:
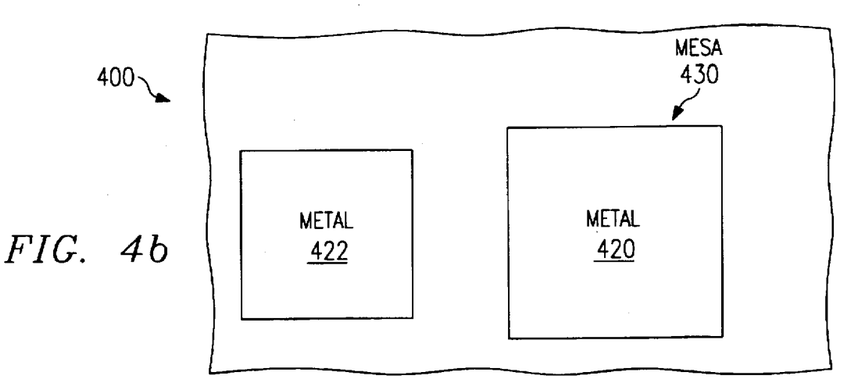

FIGS. 4a–b heuristically show first preferred embodiment mixed barrier resonant tunneling diode, generally denoted by reference numeral 400, in cross sectional elevation and plan views as including silicon collector (anode) 402, silicon dioxide ("oxide") tunneling barrier 404, silicon quantum well 406, calcium fluoride ($CaF_2$) tunneling barrier 408, silicon emitter (cathode) 410, collector metal contact 422, and emitter metal contact 420. The plan view in FIG. 4b illustrates the mesa 430 structure of the stack of tunneling barriers 404/408 and quantum well 406. Oxide tunneling barrier 404 is about 1 nm thick (roughly 4 molecular layers and amorphous) and about 2 μm by 2 μm (FIG. 4a greatly exaggerates the vertical dimensions for clarity). Calcium fluoride tunneling barrier 408 is about 1 nm thick and lattice matched to silicon emitter 410 and silicon quantum well 406. The two tunneling barriers have different characteristics, one is lattice matched crystalline and the other is amorphous, but have comparable barrier heights; this allows for simplified fabrication as compared to a structure with both oxide barriers or both calcium fluoride barriers. Quantum well 406 is about 3 nm thick. Note that the thickness of barriers 404/408 primarily impacts the tunneling current magnitude and not the resonance levels which derives from the quantum well thickness and the barrier heights. Also, the exact electronic and chemical nature of the tunneling barriers varies through the barrier.

Figure 7A:
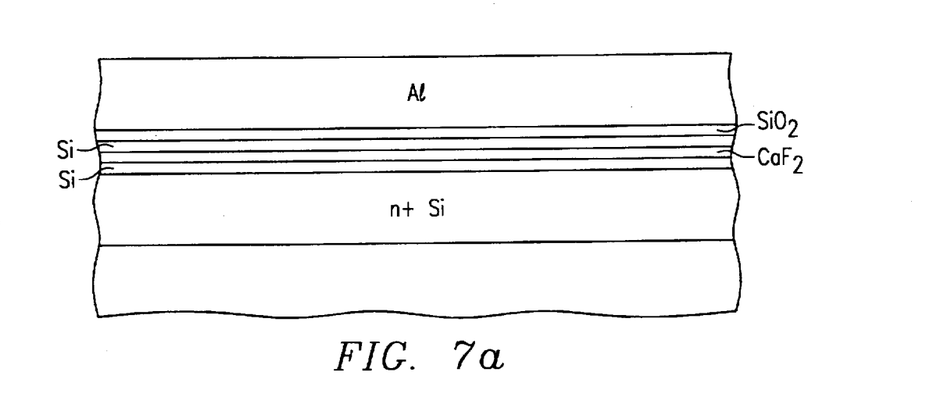
FIGS. 7a–b illustrate a metal collector variation of the preferred embodiment diode of FIGS. 4a–b.
Figure 7B:
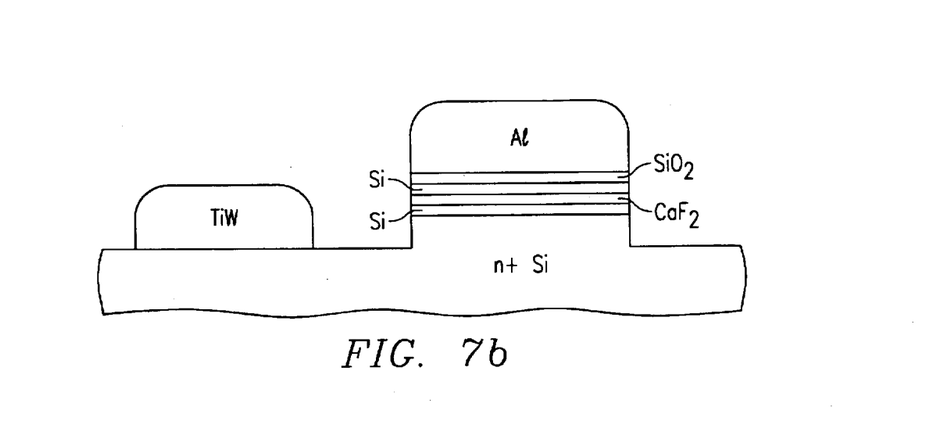

As a variation, collector 402 could be n+ polysilicon or a metal such as aluminum formed directly on oxide tunneling barrier 404 as illustrated in FIGS. 7a–b. Also, p-type doping of the emitter permits resonant tunneling of holes rather than electrons.

Figure 5A:
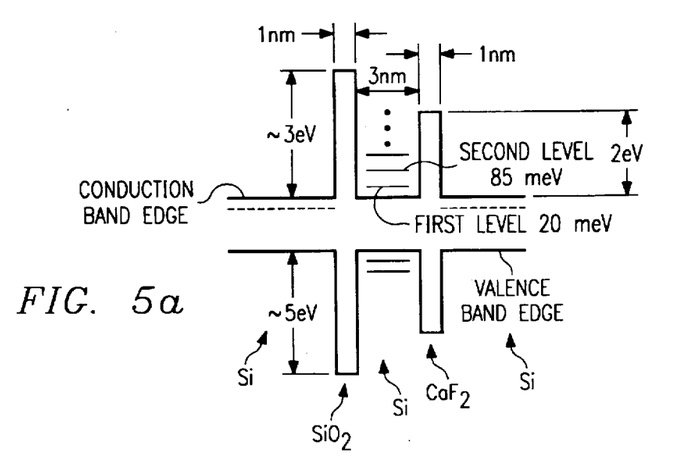
FIGS. 5a–c are band diagrams for the first preferred embodiment diode with various biases.
Figure 5B:
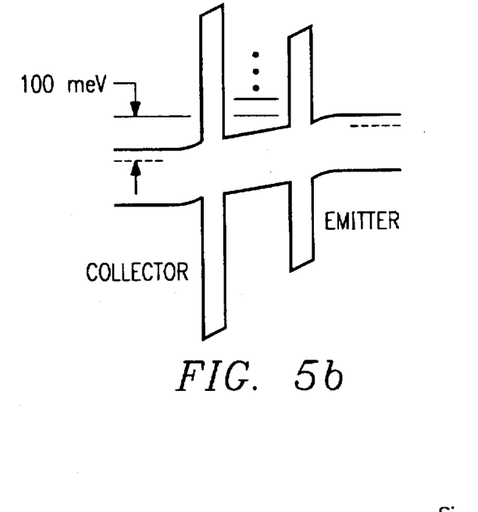
Figure 5C:
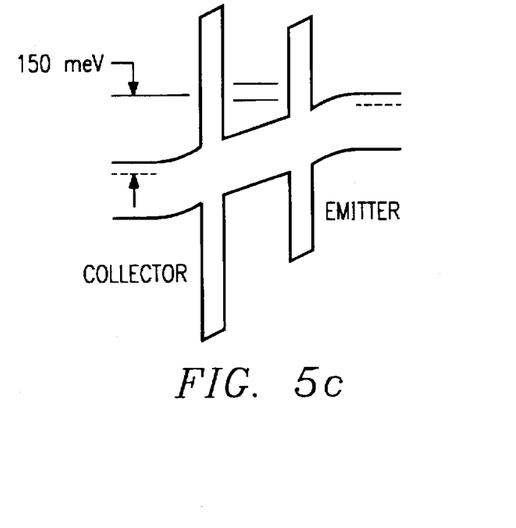

A 4 nm thickness of quantum well 406 implies the edges of the lowest conduction subbands should lie at about 20 meV, 85 meV, 200 meV, and 350 meV above the conduction band edge due to the quantized component of crystal momentum in the quantum well. The conduction band offset al the silicon/oxide interface for very thin oxide is about 2.9 eV (compared with 3.2 eV for thick oxide) and the conduction band offset at the silicon/calcium fluoride interface is about 2 eV, so FIG. 5a–c represents the band diagram for electron conduction through diode 400. FIG. 5a illustrates a zero bias which produces no current; FIG. 5b shows a bias of approximately 100 mV across the diode which yields the first resonant peak current; and FIG. 5c has a bias of approximately 150 mV across diode 400 which leads to the first valley current. Note that collector 402 may be doped n+ except for a few nm abutting barrier 404, and emitter 410 may be also be doped n+ except for a few nm abutting barrier 408. Spacing the doping from the tunneling barriers avoids incorporating dopant atoms into the tunneling barriers where impurity-assisted tunneling can result. With a doped emitter and collector, the majority of the applied bias between emitter and collector appears across the barriers and quantum well. The dielectric constant of silicon (11.7) is greater than that of oxide (3.9) and calcium fluoride (6.9), and the applied voltage drop splits across the oxide barrier, the calcium fluoride barrier, the quantum well, and the undoped emitter and collector portions abutting the barriers. The breakdown voltage for oxide is on the order of 6 MV/cm and for calcium fluoride on the order of 2 MV/cm, so to avoid breakdown currents which may destroy the tunneling barriers, voltage drops must be less than about 3 volts across the entire double barrier neglecting depletion on the emitter side of the tunneling barriers.

Epitaxial growth of calcium fluoride on emitter 410 produces tunneling barrier 408, and epitaxial growth of silicon on the calcium fluoride yields quantum well 406. Contrarily, sputtering or oxidation of the quantum well silicon produces oxide tunneling barrier 404. The oxidation may be direct thermal oxidation or ion implantation of oxygen which permits accurate control of the quantity of oxygen and hence the thickness of the oxide barrier. The sharpness of the silicon-oxide interface depends upon the segregation of the oxygen into oxide as opposed to dispersion throughout the silicon. With thermal oxidation of silicon to form oxide barrier 404, the growth of silicon collector 402 may be epitaxial by provision of openings in oxide barrier 404 for crystal alignment. Provided that the openings have dimensions less than typical electron wave packet spreads, such openings will not allow nontunneling electron transport.

Diode 400 thus provides resonant tunneling in a system in which only the tunneling barrier abutting the diode emitter needs lattice match for fabrication and may operate at room temperature.

Mixed Barrier Fabrication

Figure 6A:
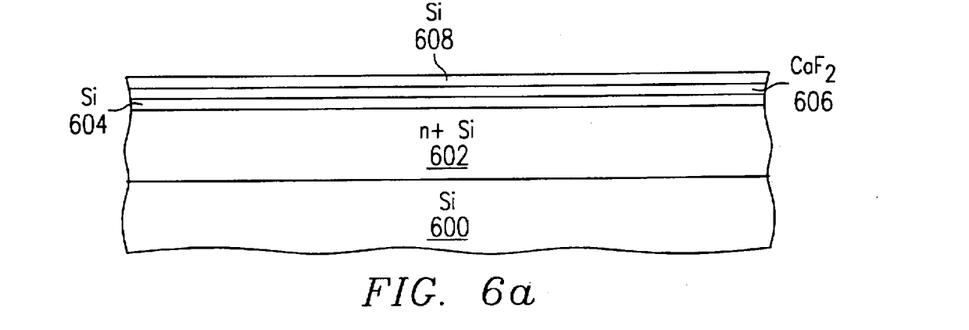
FIGS. 6a–c show fabrication steps of the first preferred embodiment method.
Figure 6B:
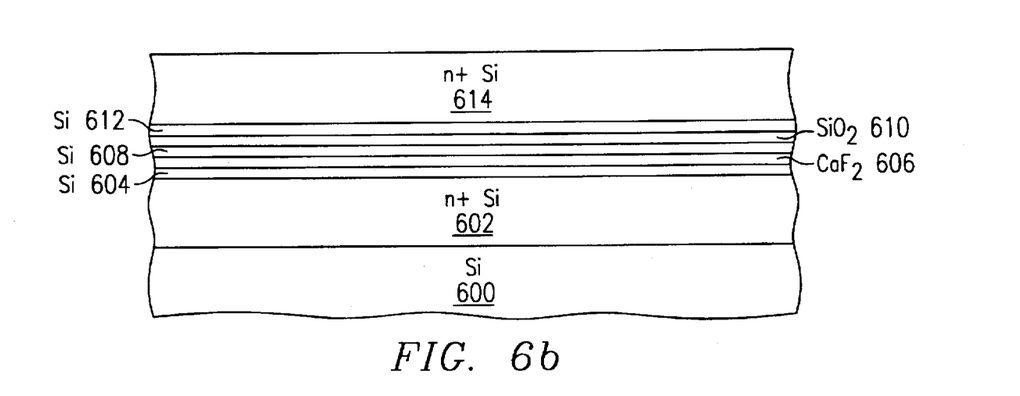
Figure 6C:
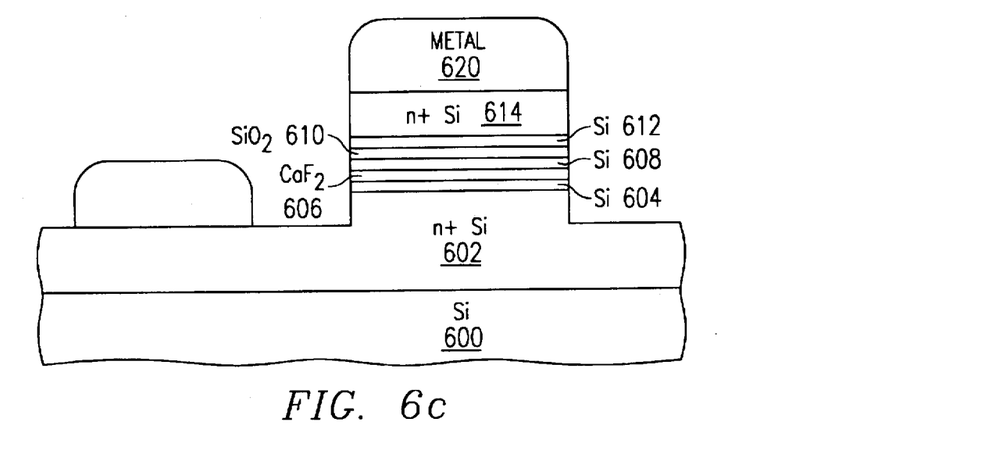

FIGS. 6a–c illustrate in cross sectional elevation views a first preferred embodiment method of fabrication of diode 400 which includes the following steps:

(1) Begin with 25-mil thick, four-inch diameter, (100)- or (111)-oriented silicon wafer 600. Insert wafer 600 into a molecular beam epitaxy (MBE) growth chamber and desorb any native oxide, and first epitaxially grow 0.1 μm of n+ doped silicon 602 as a buffer layer; a molecular beam of $Sb_4$ provides in situ doping. Next, grow 5 nm of undoped epitaxial silicon 604 at about 700° C. Then switch to epitaxial growth of calcium fluoride and grow 1 nm of undoped calcium fluoride 606 with a molecular beam of calcium fluoride and a wafer temperature at about 400° C. Lastly, switch back to epitaxial growth of silicon and grow 3.5 nm of undoped silicon 608. Note that silicon and calcium fluoride have the similar crystal structures (diamond and zinc blende) with silicon having a room temperature lattice constant of about 0.5431 nm and calcium fluoride a room temperature lattice constant of about 0.5464 nm. Thus the calcium fluoride lattice constant is about 0.6% larger than that of silicon; but layer 606 is thin enough to accommodate this mismatch with strain and maintain epitaxy. See FIG. 6a.

(2) Transfer wafer 600 in an ultrahigh vacuum from the MBE growth chamber to an oxidation chamber and and heat it to 700° C. in an oxygen atmosphere for 30 minutes to oxidize the surface of silicon layer 608 and thereby form 1 nm thick oxide layer 610 while reducing the thickness of silicon layer 608 to 3 nm. Alternatively, sputtered silicon dioxide may used in place of the thermally grown oxide; in this case the quantum well will be only 3 nm thick because it will not be consumed during oxide formation.

(3) Return wafer 600 in an ultrahigh vacuum to the molecular beam chamber machine and grow silicon or polysilicon collector layer 612–614 on oxide layer 610 with in situ antimony doping for the n+ layer 614 after the first 5 nm of undoped layer 612 analogous to the growth of silicon layers 602–604. Silicon layer 612–614 may be made single crystal by (i) recrystallization such as by laser local melting or (ii) first removing the barrier/quantum well structure from a seed area away from the mesa structure location and then growing the silicon from the seed area over the barrier/quantum well or (iii) by first providing less-than-wavelength openings in oxide layer 610 to act a seed areas for the silicon growth or (iv) by a thicker silicon quantum well with implanted oxygen for the tunneling barrier leaving an epilayer of silicon for collector growth. As the region 612–614 is used as the collector, high crystal quality is not required so long as the material does not transmit crystal defects or strain into the underlying barrier and quantum well layers.

For this reason a metal collector such as aluminum can replace the deposition of silicon 612–614 to form a layered structure as shown in FIG. 7a. Then photolithographically pattern the aluminum layer to form a collector and use it as a mask to etch and form the mesa. Lastly, deposit and pattern an emitter metal contact to complete the diode as illustrated in FIG. 7b.

Figure 8A:
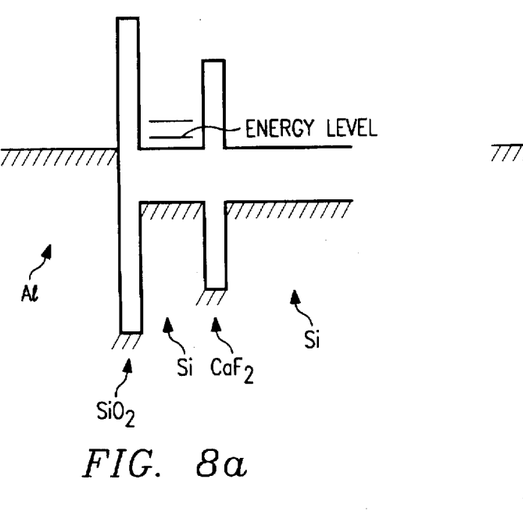
FIGS. 8a–b are band diagrams for the preferred embodiment of FIG. 7b.
Figure 8B:
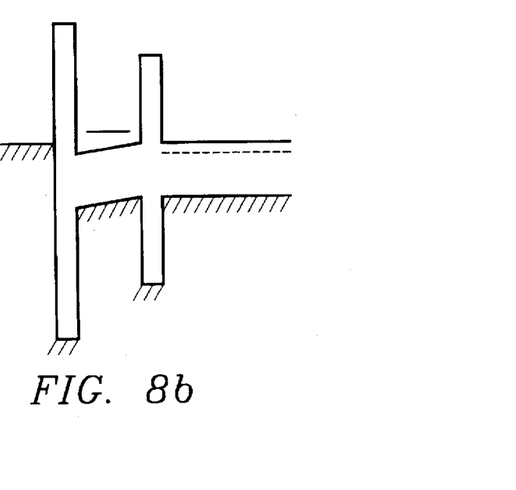

FIG. 8a is the band diagram for the aluminum collector diode with zero bias, and FIG. 8b is the band diagram at the resonance bias which is adjustable between approximately 100 mV and 2.5 V depending upon the choice of barrier and well thicknesses and undoped transition layer thicknesses.

Mixed Barriers with Metal Quantum Well and Metal Oxide Barrier

Figure 9:
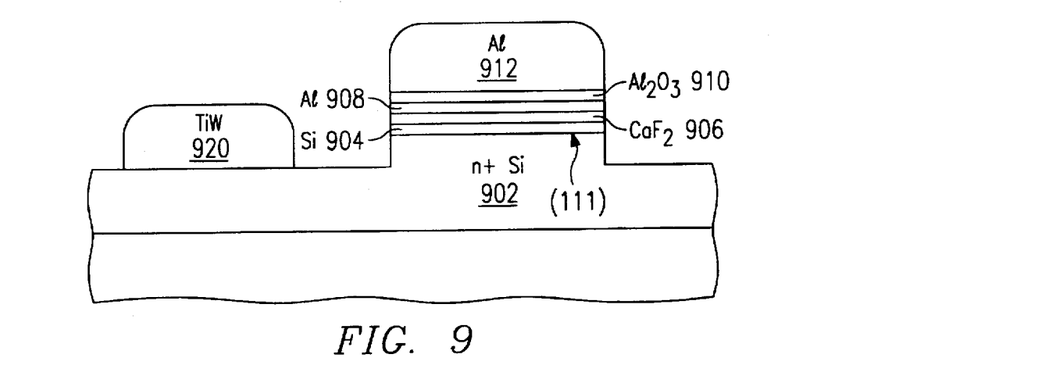
FIG. 9 illustrates a second preferred embodiment mixed barrier resonant tunneling diode.

FIG. 9 shows in cross sectional elevation view of a second preferred embodiment mixed barrier resonant tunneling diode, generally denoted by reference numeral 900, with a mesa structure and as including silicon emitter 902–904 (n+ silicon 902 plus undoped silicon 904), calcium fluoride tunneling barrier 906, aluminum quantum well 908, aluminum oxide tunneling barrier 910, aluminum collector 912, and titanium-tungsten emitter contact 920. 3 nm thick aluminum quantum well 908 lattice matches to 1 nm thick calcium fluoride tunneling barrier 906 which, in turn, lattice matches to silicon emitter 902–904. All three of these planar layers has crystal orientation (111) or (100). Aluminum oxide tunneling barrier is 1 nm thick and not lattice matched to aluminum quantum well 908, and aluminum collector 912 is polycrystalline. Further, for ease of growth of aluminum on calcium fluoride, a few atomic layers of silicon as a spacer may be grown on calcium fluoride tunneling barrier 906 prior to the aluminum quantum well growth.

Alternatively, calcium fluoride barrier 906 could be replaced with an oxide barrier 904, but then the aluminum quantum well will be polycrystalline.

Figure 10:
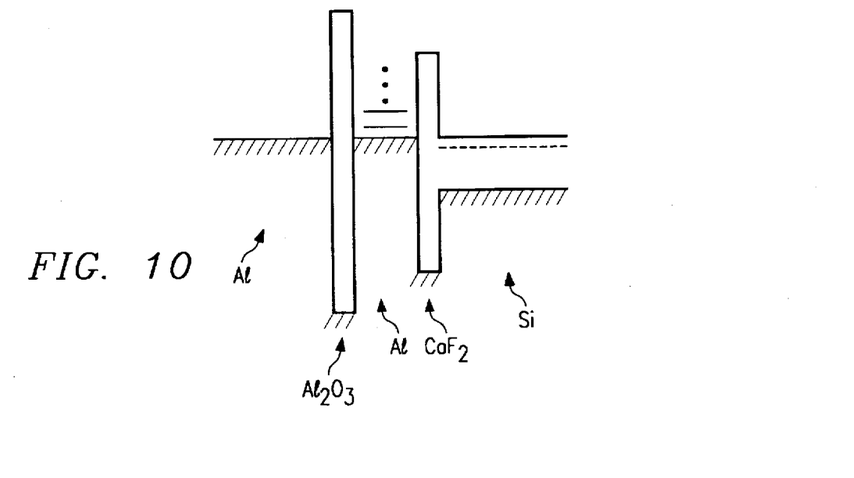
FIG. 10 is a band diagram for the second preferred embodiment mixed barrier resonant tunneling diode.

FIG. 10 is the band diagram for diode 900; again the emitter is silicon with good interface to the abutting tunneling barrier (either lattice matched calcium fluoride or thermal oxide) and the collector has less crystalline quality.

Metal Quantum Well Fabrication

Diode 900 may be fabricated by a modification of the previously-described fabrication of diode 400. In particular, follow step (1) through the calcium fluoride growth step, and then rather than switch back to epitaxial silicon growth, switch to epitaxial aluminum growth for a thickness of 4.5 nm. The wafer tempertaure may be about 25°–400° C. for the growth, and the growth may be in a metallization reactor (sputter deposit the metal) rather than a molecular beam epitaxy machine. Then oxidize the aluminum surface to a thickness of 1 nm to form the aluminum oxide layer. This oxidation may be performed in a high vacuum system with growth rates as slow as 3 nm/hr.

After the growth of the aluminum oxide, deposit aluminum collector on the aluminum oxide layer and pattern and etch to form the mesa. Liftoff of an emitter metal contact completes diode 900.

Other Crystalline Tunneling Barriers

Other materials lattice matched to silicon may be used as the first tunneling barrier in place of the calcium fluoride. In particular, zinc sulfide (ZnS), zinc selenium sulfide (ZnSeS), magnesium zinc sulfide (MgZnS), aluminum arsenic nitride (AlAsN) (see the following section of III–V nitride compounds), and silicon germanium carbide ($Si_{1-x-y}Ge_xC_y$ with the ratio x/y equal to 8.2) provide lattice match and band edge discontinuity with silicon and could be used in place of the calcium fluoride of foregoing resonant tunneling diodes.

Nitride III–V Tunneling Barriers and Quantum Well

Figure 11:
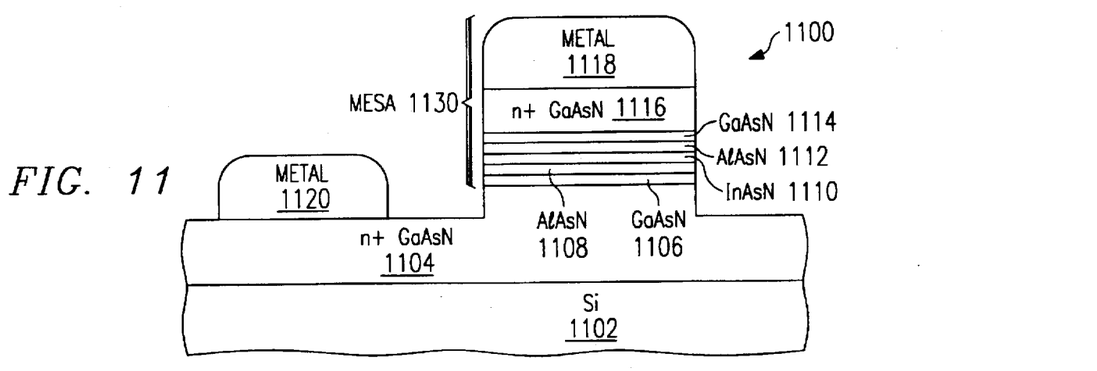
FIG. 11 shows a third preferred embodiment resonant tunneling diode.

FIG. 11 illustrates in cross sectional elevation view third preferred embodiment resonant tunneling diode 1100 which includes silicon wafer 1102, $GaAs_{0.81}N_{0.19}$ emitter (n+ layer 1104 and undoped layer 1106), $AlAs_{0.82}N_{0.18}$ tunneling barriers 1108 and 1112, $InAs_{0.41}N_{0.59}$ quantum well 1110, $GaAs_{0.81}N_{0.19}$ collector (n+ layer 1116 and undoped layer 1114), and metal contacts 1118 and 1120. The GaAsN, AlAsN, and InAsN all have a zincblende lattice which matches that of silicon. AlAsN tunneling barriers 1108 and 1112 each has a thickness of 1 nm, InAsN quantum well 1110 has a thickness of 3 nm, and the undoped portions 1106 and 1114 of the GaAsN emitter and collector each has a thickness of a few nm. Mesa 1130 has lateral dimensions of 20 μm and 20 μm.

Figure 12:
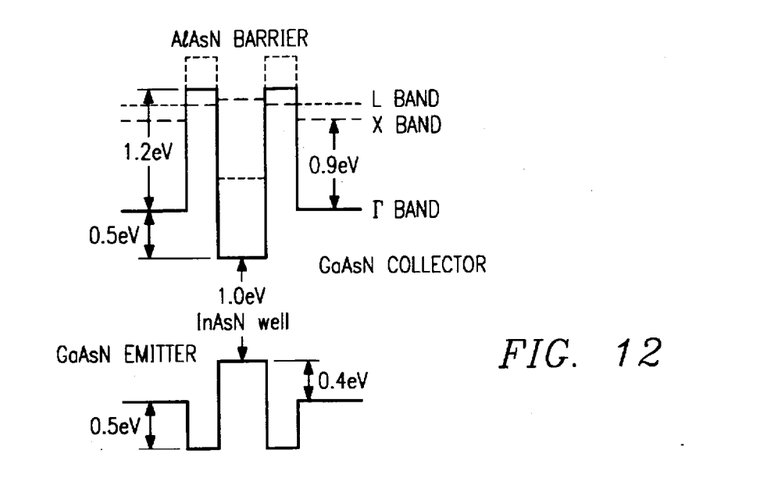
FIG. 12 is a band diagram for the embodiment of FIG. 11.

FIG. 12 is the band diagram for diode 1100 and shows the band edge discontinuites. Note that the electron energies for the X and L points (crystal monmentum of (1,0,0)2π/a and (1/2,1/2,1/2)2π/a) of the conduction band in addition to the Γ point (crystal momentum of (0,0,0)2π/a) are shown. The large energy difference between the X,L and Γ points (0.9 eV) suggests the resonant tunneling diode will have low valley currents and a high peak-to-valley current ratio for room temperature operation.

Figure 13:
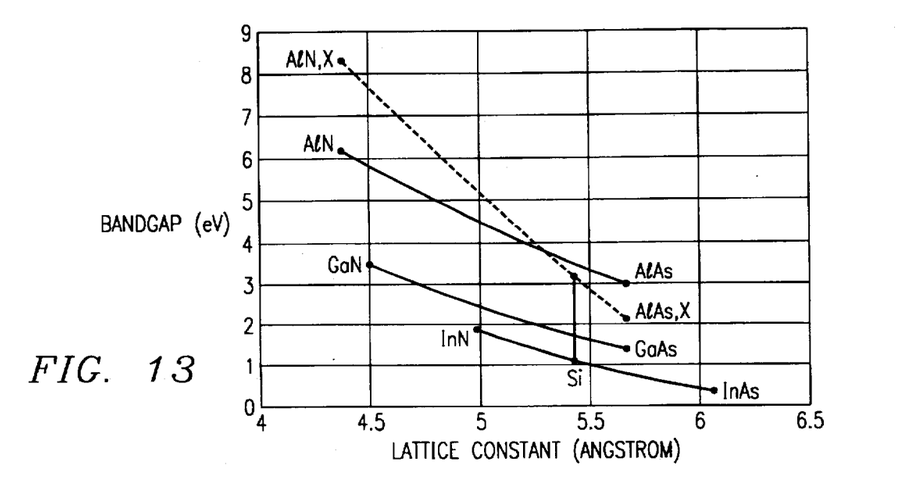
FIG. 13 illustrates lattice constants.

FIG. 13 shows the bandgap and lattice constant for the III–V semiconductor compounds with Al, Ga, or In as the Group III element and As or N as the Group V element. The bandgaps for alloys of these compounds which are lattice matched to silicon vary from about 1.0 eV ($InAs_{0.41}N_{0.59}$) to about 3.0 eV ($Al_{0.8}Ga_{0.2}As_{0.8}N_{0.2}$), and these are direct bandgap materials. This large range of bandgaps permits various optoelectronic devices on silicon such as monolithic color displays, lasers of all visible wavelengths, and so forth.

A variation of diode 1100 replaces the GaAsN emitter and collector with an InAsN emitter and collector so that the quantum well and the emitter and collector are all of the same material. Similarly, a variation of diode 1100 replaces the InAsN quantum well with GaAsN so again the emitter and collector and quantum well are all of the same material. These structures use fewer materials and simplify the fabrication.

Generally, use of quaternary III–V nitride compounds such as $In_xAl_{1-x}As_yN_{1-y}$ and $Al_xGa_{1-x}As_yN_{1-y}$ permit bandgap engineering while maintaining silicon lattice match.

Nitride Based III–V and Silicon Tunneling Barriers and Quantum Well

Figure 14:
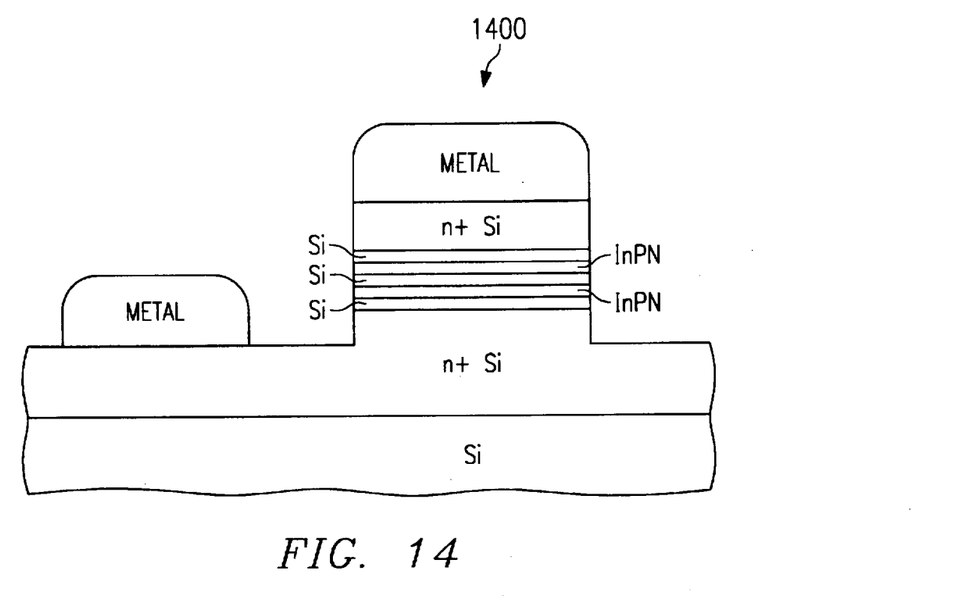
FIG. 14 shows a fourth preferred embodiment resonant tunneling diode.
Figure 15:
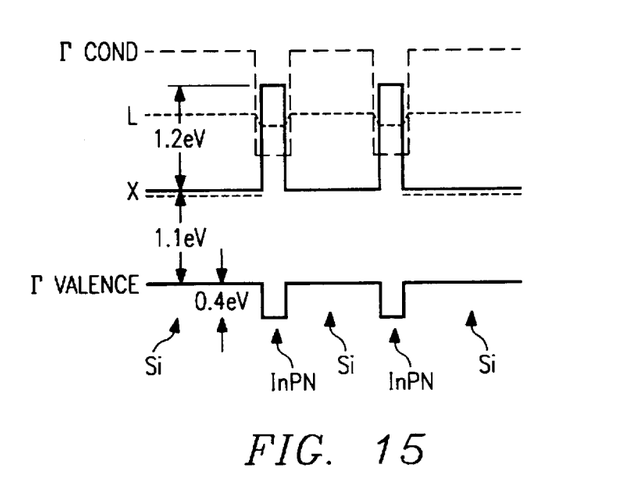
FIG. 15 is a band diagram for the embodiment of FIG. 14.

A fourth preferred embodiment resonant tunneling diode 1400 uses silicon plus silicon lattice matched III–V semiconductor compounds for the quantum well and tunneling barriers. In particular, FIG. 14 shows diode 1400 including silicon emitter and collector and quantum well together with $InP_{0.5}N_{0.5}$ tunneling barriers. FIG. 15 is the band diagram. The low energy valley in the conduction band of silicon lies near the X point, so FIG. 15 shows the X point energy along with an indication of the L and $\Gamma$ point energies. The band discontinuity at the X point of 1.1 eV provides sufficient tunneling barrier height.

A variation of diode 1400 replaces the InPN tunneling barriers with $AlAs_{0.82}N_{0.18}$ tunneling barriers which will give a 1.3 eV discontinuity. Also, strained layers made of $AlP_xN_{1-x}$ and $GaP_xN_{1-x}$ could be used in place of the InPN.

Other Substrates

The III-V nitride compounds which lattice match to silicon (lattice constant 0.5431 nm at room temperature) may be slightly compositionally varied to also lattice match gallium phosphide (GAP) substrates which have a room temperature lattice constant of 0.5451 nm. FIG. 13 indicates a slight increase in the As to N ratio suffices. Thus analogous resonant tunneling structures are available on GAP.

Nitride Based III-V Fabrication

Fabrication of diode 1100 simply includes molecular beam epitaxy of the various layers followed by collector metal contact formation and a mesa etch plus emitter metal contact formation. The nitrogen source may use molecular nitrogen which is dissociated in a plasma to form a beam of atomic nitrogen; the other element sources may be effusion cells. Similarly, chemical beam epitaxy may be used for the layer growth with sources such as trimethylgallium for gallium, tertiarybutylarsine for arsenic, tertiarybutylphosphine for phosphorus, and an ECR plasma source for atomic nitrogen.

Of course, the symmetry of diode 1100 eliminates the emitter/collector distinction. However, the lattice match III-V nitrides could be used for the crystalline barrier in the mixed barrier diodes.

Multipeak Resonances

The single crystal collector embodiments (FIGS. 4, 11, 14) may be extended to multiple quantum wells in series to form resonant tunneling diodes with multiple resonant peaks simply by growing further tunneling barriers and quantum wells on the preferred embodiment structures. With quantum well sized emitter/collectors such multiple quantum wells in series will form a superlattice.

Applications

Any of the foregoing resonant tunneling diodes could be imbedded in the emitter of a bipolar transistor to form a resonant tunneling bipolar transistor.

Figure 16A:
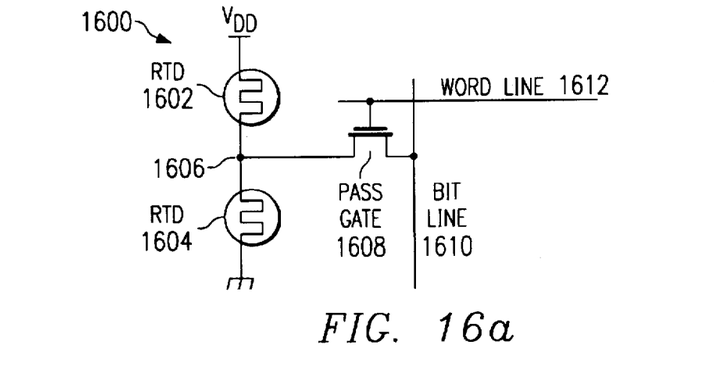
FIGS. 16a–c show a memory cell application of the preferred embodiment diodes.
Figure 16B:
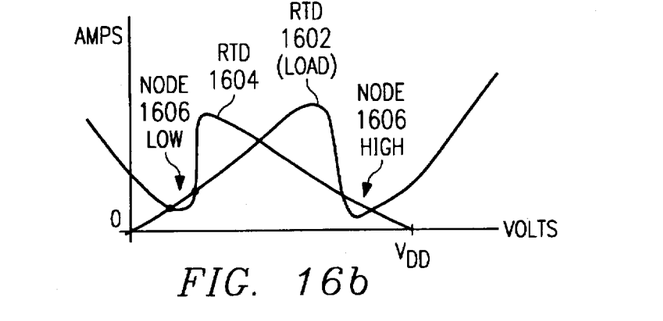

Two of the preferred embodiments diodes may be incorporated into various structures such as the memory cell illustrated in FIGS. 16a–c. In particular, FIG. 16a schematically shows static random access memory (SRAM) cell 1600 as including resonant tunneling diodes (RTDs) 1602 and 1604 in series (RTD 1602 acts as the load for RTD 1604) and coupled to bitline 1610 by silicon field effect transistor pass gate 1608 controlled by the voltage on word line 1612. The histability of node 1606 of cell 1600 derives from the bias voltage Vdd being set a little greater than the current valley of each RTD, so one RTD operates in its valley and the other RTD operates with small bias. FIG. 16b shows the superimposed current-voltage curves for RTDs 1602–1604 where each RTD has the characteristics illustrated in FIG. 2. The intersection points (a pair for the voltage on node 1606 close to Vdd (high) and a pair for node 1606 (low) indicate the stable series operation points. And accessing node 1606 through pass gate 1608 with a large driver to force node 1606 either high or low will force cell 1600 into a desired stable state; whereas, a sense amplifier accessing node 1606 through pass gate 1608 will detect the cell's state without disruption. Of course, a larger peak-to-valley ratio in the RTDs than that shown in FIG. 2 will make the high and low stable voltages for node 1606 closer to Vdd and 0, respectively.

Figure 16C:
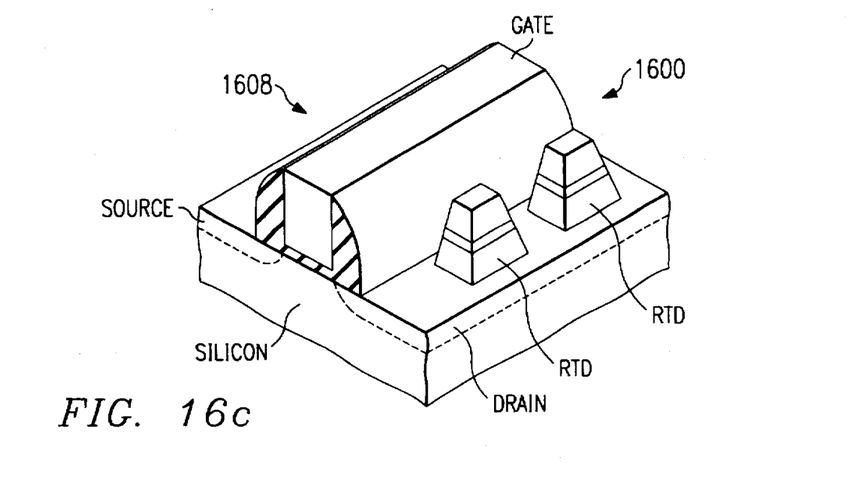

FIG. 16c illustrates in perspective view the structure of FIG. 16a using a single silicon field effect transistor plus the preferred embodiment RTDs. Note that the parallel arrangement of the RTDs on the field effect transistor drain permits simultaneous fabrication with a mesa etch defining the locations of the RTDs. The integration of the foregoing resonant tunneling structures with standard silicon devices can be either with the rsonant tunneling processing performed first, or the silicon devices fabricated first, or an intermingling of the processing. A common metallization could follow the device fabrication.

Modifications and Advantages

The preferred embodiments may be varied in many ways while retaining one or more of the features of silicon compatible resonant tunneling structures with mixed tunneling barriers or nitride based III-V compounds.

For example, the dimensions of the tunneling barriers and quantum well(s) could be varied: the tunneling barriers could be thinner for higher current, the tunneling barriers could be of differing thicknesses, and the quantum well thickness could be varied to adjust the resonant levels up or down.

What is claimed is:

1. A resonant tunneling diode, comprising:

an emitter;

a first tunneling barrier made of a first material and abutting said emitter;

a quantum well abutting said first tunneling barrier;

a second tunneling barrier made of a second material different from said first material and abutting said quantum well; and a collector abutting said second tunneling barrier, wherein:

said first material is crystalline; and said second material is amorphous.

2. A resonant tunneling diode, comprising:

an emitter;

a first tunneling barrier made of a first material and abutting said emitter;

a quantum well abutting said first tunneling barrier;

a second tunneling barrier made of a second material different from said first material and abutting said quantum well; and a collector abutting said second tunneling barrier, wherein:

said emitter is silicon, said first tunneling barrier is calcium fluoride;

said quantum well is silicon; and said second tunneling barrier is silicon dioxide.

3. A resonant tunneling diode, comprising:

an emitter;

a first tunneling barrier made of a first material and abutting said emitter;

a quantum well abutting said first tunneling barrier;

a second tunneling barrier made of a second material different from said first material and abutting said quantum well; and a collector abutting said second tunneling barrier, wherein:

said emitter is silicon;

said first tunneling barrier is calcium fluoride;

said quantum well is aluminum; and said second tunneling barrier is aluminum oxide.

* * * * *